United States Patent [19]

Dahlberg

[11] 4,291,191

[45] Sep. 22, 1981

[54] SOLAR CELL ARRANGEMENT

[75] Inventor: Reinhard Dahlberg, Flein, Fed. Rep. of Germany

[73] Assignee: Licentia Patent-Verwaltungs G.m.b.H., Frankfurt am Main, Fed. Rep. of Germany

[21] Appl. No.: 165,108

[22] Filed: Jul. 1, 1980

[30] Foreign Application Priority Data

Jul. 3, 1979 [DE] Fed. Rep. of Germany ....... 2926754

[51] Int. Cl.³ .......................................... H01L 31/06
[52] U.S. Cl. ................................... 136/246; 136/247; 136/255; 136/256; 136/259; 357/15; 357/30
[58] Field of Search ............... 136/246, 247, 255, 256, 136/259; 357/15, 30

[56] References Cited

U.S. PATENT DOCUMENTS

| | | | |
|---|---|---|---|
| 4,029,519 | 6/1977 | Schertz et al. | 136/246 |
| 4,045,246 | 8/1977 | Mlavsky et al. | 136/246 |
| 4,118,249 | 10/1978 | Graven et al. | 136/246 |
| 4,140,142 | 2/1979 | Dormidontov et al. | 136/246 |
| 4,151,005 | 4/1979 | Strebkov et al. | 136/256 |

FOREIGN PATENT DOCUMENTS 2620115 11/1977 Fed. Rep. of Germany ...... 136/247
2757765 2/1979 Fed. Rep. of Germany ...... 136/246

OTHER PUBLICATIONS

M. A. Green et al., "The MIS and MISIM Solar Cell", *Proceedings International Photovoltaic Solar Energy Conf.*, Sep. 1977, Luxembourg, Reidel Pub. Co., pp. 299–307.

*Primary Examiner*—Aaron Weisstuch
*Attorney, Agent, or Firm*—Spencer & Kaye

[57] ABSTRACT

A solar cell arrangement comprises a first plate or disc of light transmissive material, one side of the first plate or disc having a structure of light transmissive elevations tapering parabolically and cut off parallel to the surface of the plate or disc at the level of their focal points or lines, the structure having a layer of at least partially light transmissive electrically conductive material on the surface of the elevations and a second plate or disc of semiconductor or metallically conducting material, the plate or discs being assembled together to provide photo voltaic and electical contacts between the said cut off surfaces, of one plate or disc and the surface of the other plate or disc such that light passing through the first plate is concentrated at the contacts.

18 Claims, 3 Drawing Figures

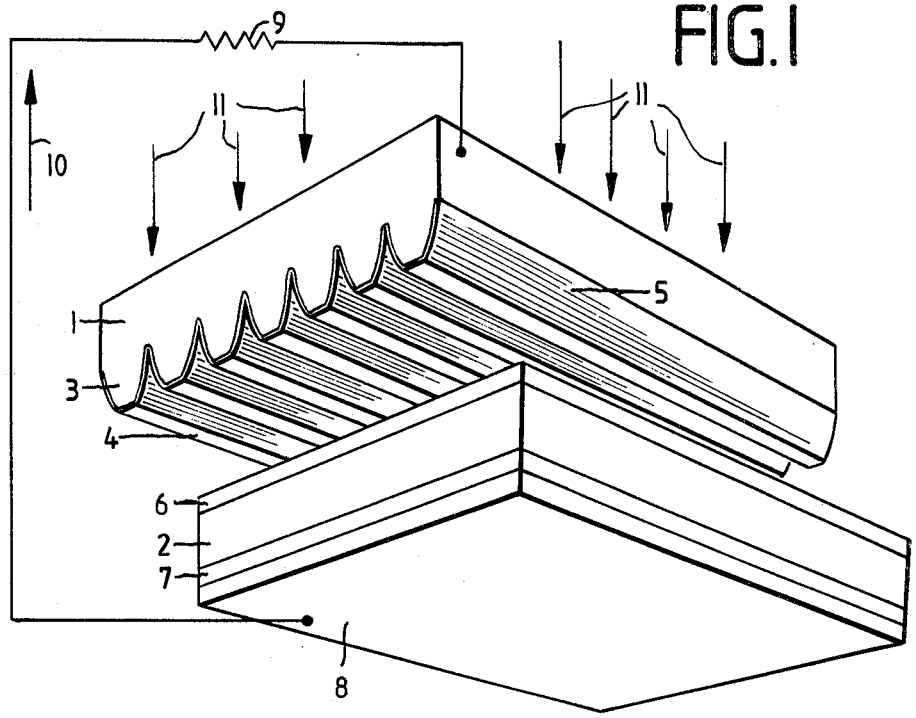
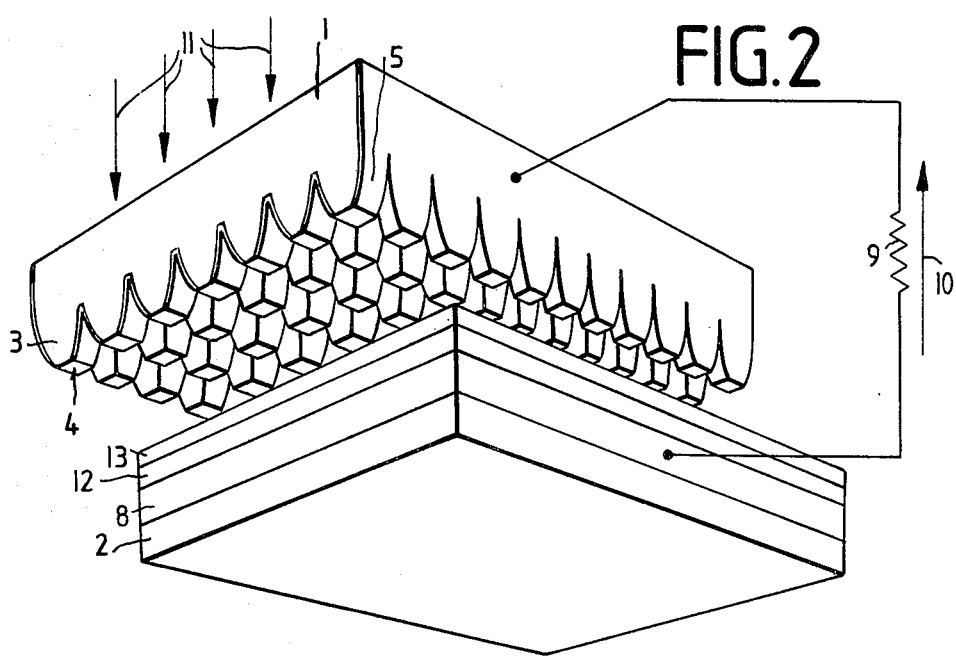

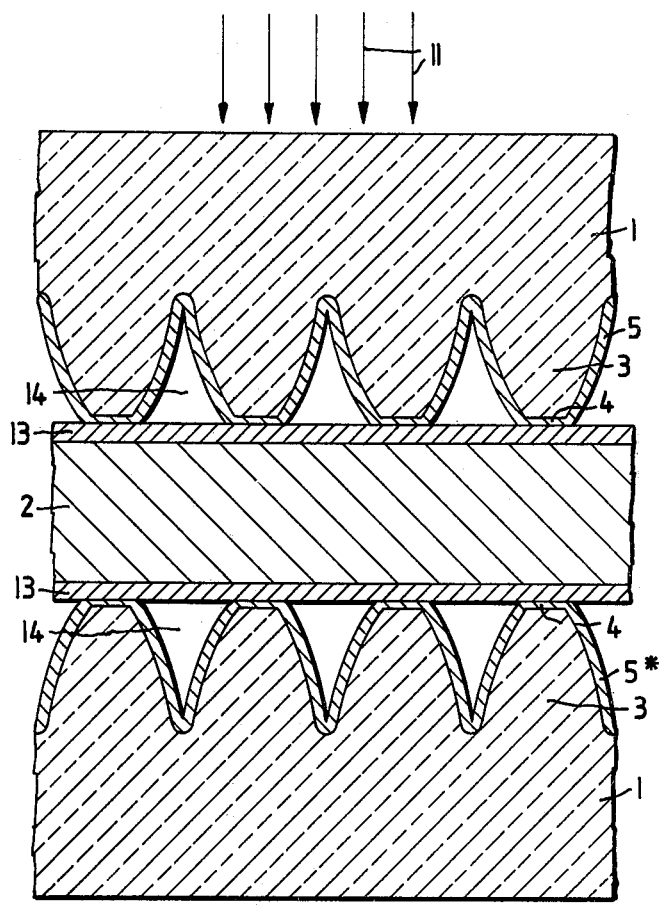

SOLAR CELL ARRANGEMENT

BACKGROUND OF THE INVENTION

The invention relates to a solar cell which facilitates conversion of energy from the sun at a high degree of efficiency and at low cost.

The main problem of the terrestrial use of solar cells lies, as is known, in the manufacture of a sufficiently cheap solar cell with the highest possible degree of efficiency. Since the cost of silicon plays a key role in this, there has been no lack of attempts to break away from expensive monocrystalline material and to use polycrystalline or amorphous silicon for solar cells. Unfortunately, solar cells made from these materials have poor efficiency.

The concept of the MIS and MISIM solar cells (M. A. Green and R. B. Godfrey) "The MIS and MISIM Solar Cell" Proceedings of the 1st International Photovoltaic Solar Energy Conference, Sept. 27–30, 1977, pp. 299–307) represents a substantial step forward in improving the degree of efficiency of polycrystalline solar cells. M stands for metal, I for a very thin insulator layer, and S for semiconductors. The grain limit recombination of polycrystalline material in these structures is largely eliminated. The concentration and increase in intensity of incident sunlight is a further measure for increasing the degree of efficiency of a solar cell. Since the temperature coefficient for maximum power in a silicon solar cell is, say 0.5% per degree, the efficiency when heating the solar cell from 0° C. to 100° C. is reduced approximately 50%. For this reason, the solar cell must be cooled reliably in the case of concentrated sunlight. This additional cooling and the means for concentrating the sunlight involve additional costs.

SUMMARY OF THE INVENTION

It is an object of the invention to provide a solar cell in which a concentration of the sunlight can take place in the solar cell itself and in which hardly any additional heating of the solar cell is caused by the concentrated sunlight and without additional cooling being necessary.

According to the invention, there is provided a solar cell arrangement comprising a first plate or disc of light transmissive material having a structure of light transmissive elevations tapering parabolically on one side of said first plate or disc and cut off in parallel with the surface of said first plate or disc at the level of their focal points or lines, a layer of at least partially light transmissive electrically conductive material on the surface of said elevations and a second plate or disc of semiconductor or metallically conductive material assembled to said first plate or disc to provide photovoltaic or electrical contacts between said cut off surfaces of said elevations of said first plate or disc with the surface of said second plate or disc, whereby light which passes through said first plate or disc is concentrated at said contacts.

Further accordingly to the invention there is provided a solar cell arrangement, in which two separate plates or discs are provided; one plate or disc comprises light-transmissive material; one side of this plate or disc has a regular structure of light-transmissive elevations which taper parabolically; these parabolic elevations are cut off in parallel with the surface of the plate or disc at the level of their focal points or lines; the surface of the parabolic elevations is coated with an at least partially light-transmissive, electrically conductive layer; the second plate or disc of the arrangement comprises semiconductor or metallically conductive material; and both plates or discs are assembled mechanically so that the cut off surfaces of the parabolic elevations form photovoltic or electrical contacts with the surface of the semiconductor or metallically conductive plate or disc which has been pre-treated accordingly, so that light which passes through the light-transmissive plate or disc is concentrated at the contacts.

BRIEF DESCRIPTION OF THE DRAWINGS

The invention will be described in greater detail, by way of example with reference to the drawings, in which;

FIG. 1 shows in perspective exploded view a solar cell arrangement in accordance with the invention having a monocrystalline silicon plate;

FIG. 2 shows in perspective exploded view a solar cell arrangement in accordance with the invention with a GaAs layer; and FIG. 3 shows a insectional view a solar cell arrangement in accordance with the invention with a polycrystalline silicon and a MISIM structure.

Basically, the invention proposes to provide two separate plates or discs in the solar cell, one plate or disc comprising a light-transmissive material, one side of this plate having a regular structure of light-transmissive elevations which taper parabolically; these parabolic elevations being cut off in parallel with the surface of the plate or disc at the level of their focal points or focal lines; the surface of the parabolic elevations being coated with an at least partially light-transmissive, electrically conductive layer; the second plate or disc of the arrangement comprising semiconductor or metallically conductive material; and the two plates or discs being assembled mechanically so that the cut off surfaces of the parabolic elevations form photovoltaic or electrical contacts with the surface of the semiconductor or metallically conductive plate or disc which has been pretreated accordingly, light which passes through the light-transmissive plate or disc being concentrated on these contacts.

The second plate or disc may comprise monocrystalline semiconductor material and a p/n junction on one side and a blocking layer-free contact on the other side.

The second plate or disc may moreover comprise semiconductor material and be coated on both sides with an insulator layer, the thickness of which is less than $1 \times 10^{-6}$ cm. Both the photovoltaic contact and the second contact on the semiconductor body are formed as MIS contacts with a small insulating layer (MIS) between the metal and the semiconductor body. Then two metals having very different work functions of electrons are to be used for the two sides of the semiconductor plate, the work functions of electrons being selected so that the photovoltaic MIS contact has rectifying properties while the other MIS contact is non-rectifying.

The semiconductor material may be either monocrystalline or polycrystalline and have n- or p type -conductivity. The solar cell arrangement may be manufactured by placing a semiconductor having a thin insulating layer between two plates made of light-transmissive material having different metallizations, which may be pressed together and faced or melted under vacuum.

The structure having the parabolic elevations may comprise parallel ridges having a rectangular base and parabolic cross-section.

The parabolic elevations may rise and taper from square base surfaces, however, so that each cross-section through an elevation is parabolic and perpendicular to a square base surface.

The elevations are preferably clipped at their outer face so that narrow abutment surfaces are formed. Inorganic material such as glass, quartz, sapphire inter alia, or organic material such as polycarbonate epoxide, polyacrylonitrile inter alia may be used as the light-transmissive material for the first plate or disc.

The intermediate space between the plates or discs may be evacuated but may also be filled with inert gas, prospective gas or a preservative liquid (e.g. oil).

The second plate or disc may also comprise metal or a metallic material and have a polycrystalline semiconductor layer made from a III/V or II/VI compound.

Thermal or reactively produced oxides, chemically, or electrochemically produced oxides, oxides vaporized or atmomized at high vacuum, nitrides, sulphides, chalcogenides etc., or organic insulators may be used as the thin insulating layers for the MIS or MISIM structures.

Be, Al, Zr, Hf, Zn, rare-earth metals, $LaB_6$, $YB_6$, $GdB_6$, $WB_2$, BaSe and others may be used for the at least partially light-transmissive, metallically conductive layers for small work functions of electrons (in the case of photovoltaic MIS contacts for p-semiconductors and non blocking MIS contacts or n-semiconductors). Pt, Pd, Ru, Au, Ni Cu, Fe, $TbB_6$, $EuB_6$, $SmB_6$, $MuB_6$, $TiB_6$ and others may be used for large work functions of electrons (in photovoltaic MIS contacts for n-semiconductors and non blocking, MIS contacts for p-semiconductors). The incident sunlight may be concentrated by lenses, mirrors or fluorescence collectors.

Three embodiments of the invention will now be described with reference to the drawings:

EMBODIMENT 1

In FIG. 1, 1 is a plate made from polycarbonate which is manufactured in a hot press method together with the parabolic elevations 3. The parabolic elevations 3 have an elongate rectangular base surface and run in parallel to each other. Their height is $4 \times 10^{-2}$ cm, and their outer face cut-off surface 4 has a width of $2 \times 10^{-2cm}$. 2 is a p-conductive monocrystalline silicon plate which has a thin $n^+$-layer 6 on one side (with the photovoltaic $n^+/p$ junction) and a $p^+$-region 7 and a metal contact 8 on the other side. The surface of the parabolic elevations 3 is coated with a light-transmissive layer of gold 5. When pressing together plates 1 and 2 the layer of gold 5 on the cut off surfaces 4 forms an electrical contact with the $n^+$-layer 6 on the disc 2. When the light 11 shines into the light-transmissive plate 1 the light 11 is concentrated in the parabolic elevations 3. The concentrated light 11 passes into the surface of the region 6 on the plate 2 through the cut off surfaces 4. The photovoltage produced thereby is tapped off between the layer of metal 5 and the metal contact 8. This voltage drives the current 10 through the load resistor 9.

The arrangement according to FIG. 1 is not optimal because only approximately half of the $n^+/p$-junction 6/2 is impinged by the concentrated light 11.

EMBODIMENT 2

In FIG. 2, 1 is a glass plate which was provided on one side with parabolic elevations 3 by means of a hot press process. The surface of these parabolic elevations is coated with a layer 5 of metal which is light-transmissive only at the cut off surfaces 4. 2 is a graphite plate which has a thin layer 8 of molybdenum on one side. A polycrystalline n-GaAs layer 12 having a thickness of $2 \times 10^{-4}$ cm is applied to the non-blocking layer 8 of molybdenum. The surface of the GaAs layer 12 is coated with an insulating layer 13 which is $2 \times 10^{-7}$ cm thick. By pressing the glass plate 1 together with the plate 2, the metallized cut-off surfaces 4 form a photovoltaic MIS contact with the surface of the insulator-coated GaAs layer 12. The incident sunlight 11 is concentrated by a factor of 5 for example, with the aid of a Fresnel lens. Since, due to the parabolic elevations 3, it is concentrated again by a factor of 4 it hits the photovoltaic MIS contact 4/13/12 with approximately 20 times the intensity of the radiation from the sun. The photovoltage is tapped off between the metal layer 5 and the non blocking molybdenum contact 8. 9 is a load resistor and 10 is the photocurrent.

EMBODIMENT 3

In FIG. 3, 2 is a polycrystalline $0.5\Omega$-cm p-silicon plate of $10 \times 10$ $cm^2$ and a thickness of $5 \times 10^{-2}$ cm. It is coated completely with a thermal $SiO_2$ layer 13 with a thickness of $1.5 \times 10^{-7}$ cm. 1 are two glass plates each $10 \times 10$ $cm^2$ large and having a thickness of $1.5 \times 10^{-1}$ cm. Of this thickness, approximately $3 \times 10^{-2}$ cm is the height of parabolic elevations 3, the square cut-off surfaces 4 at the outer face of the elevations being approximately $1 \times 10^{-4}$ $cm^2$. The surfaces of the parabolic elevations 3 on the upper plate 1 are coated with a layer 5 of aluminum which is light-transmissive only at the cut off surfaces 4. The surfaces of the parabolic elevations 3 on the lower disc 1 are coated with a layer 5* of nickel which is only light transmissive at the cut off surfaces 4. Each glass plate 1 has approx. $2.5 \times 10^5$ parabolic elevations 3. The silicon plate 2 is located between the structured sides of the two glass plates 1. Since the intermediate space 14 between the parabolic elevations 3 is evacuated, the three discs 1/2/1 are pressed together very evenly by the external atmospheric pressure. The cut-off surfaces 4 of the parabolic elevations 3 on the upper plate 1 from photovoltaic MIS contacts with the plate 2. The cut off surfaces 4 of the parabolic elevations 3 on the lower plate 1 form non blocking MIS contacts with the plate 2. The photovoltage produced during the incidence of light 11 is tapped off between the aluminum layer 5 of the upper plate 1 and the nickel layer 5* of the lower plate 1.

As a result of the parabolic elevations 3, the light 11 incident into the upper plate 1 shines into the photovoltaic MIS contacts concentrated by a factor of 4. Thus the degree of efficiency of the solar cell is increased. Additional heating of the MIS contacts does not effectively take place because the heat conduction from these "point contacts" is very large.

A complementary solar cell arrangement in accordance with FIG. 3 may be manufactured by using an n-silicon plate. Only the lower plate 1 in FIG. 3 need be exchanged with the upper plate 1.

Solar batteries may be formed by connecting together alternate p-silicon and n-silicon solar cell arrangements, these batteries having particularly small electrical connection paths from one solar cell to the next.

A total intensity increase in the sunlight by more than a factor of 10 may be achieved very easily with the aid of an additional external concentration of the sunlight through a Fresnel lens, a mirror or a fluorescence collector. The solar cell arrangement may be cooled in a manner known per se.

A quite substantial advantage of the solar cell arrangements according to FIGS. 2 and 3 lies in the fact that each individual photovoltaic contact with the light-transmissive metallized cut-off surfaces 4 of the parabolic elevations 3 is very small in terms of area ($1 \times 10^{-4}$ cm$^2$) and may be made substantially smaller than this. Thus the necessity of having to produce insulating layers 13 which are pore-free and large in area is avoided.

Since the parabolic elevations 3 are coated in a relatively thick layer of metal of for example some $10^{-4}$ cm thick (only the metallisation of the cut off surfaces 4 is light transmissive), the solar cell arrangements according to FIGS. 2 and 3 are also very low in resistance.

It will be understood that the above description of the present invention is susceptible to various modifications, changes and adaptations.

What is claimed is:

1. A solar cell arrangement, in which two separate plates or discs are provided; one plate or disc comprises light-transmissive material; one side of this plate or disc has a regular structure of light-transmissive elevations which taper parabolically; these parabolic elevations are cut off parallel to the surface of the plate or disc at the level of their focal points or lines; the surface of the parabolic elevations is coated with an at least partially light-transmissive, electrically conductive layer; the second plate or disc of the arrangement comprises semiconductor or metallically conductive material; and both plates or discs are assembled mechanically so that the cut off surfaces of the parabolic elevations form photovoltaic or non-blocking electrical contacts with the surface of the semiconductor or metallically conductive plate or disc so that light which passes through the light-transmissive plate or disc is concentrated at the contacts.

2. A solar cell arrangement as defined in claim 1, wherein said the parabolic elevations are coated at least partially with a light-transmissive metal layer and the second plate or disc is a monocrystalline semiconductor plate or disc with a p/n junction on the surface in contact with said cut off surfaces of said parabolic elevations and a second non blocking contact on the opposite surface.

3. A solar cell arrangement as defined in claim 2, wherein said semiconductor plate or disc is coated with an insulator layer having a thickness less than $1 \times 10^{-6}$ cm; and both said photovoltaic contact and said second non blocking contact on said semiconductor body each comprise a metal/insulator/semiconductor contact.

4. A solar cell arrangement as defined in claim 3, wherein the electron work functions of the metals provided for the metal/insulator/semiconductor contacts are selected so that the photovoltaic contact has rectifying properties while the second contact at the surface of said semiconductor plate or disc opposite said photovoltaic contact is non blocking.

5. A solar cell arrangement as defined in claim 1, and comprising a monocrystalline or polycrystalline n- or p-conductive silicon plate or disc coated on both sides with a thin insulator layer, pressed between the parabolically structured sides of two light-transmissive plates or discs and sealed under vacuum with the surfaces of the structured sides of said light-transmissive plates or discs bearing thin metal coatings, said metal coatings comprising metals having electron work functions which vary in magnitude such that a photovoltaic metal/insulator/semiconductor contact is formed on one side of said semiconductor disc and a non blocking metal/insulator/semiconductor contact is formed on the opposite surface of said semiconductor body.

6. A solar cell arrangement as defined in claim 5 wherein said thin insulator layers comprise quartz.

7. A solar cell arrangement as defined in claim 1, wherein said structure of parabolic elevations comprises parallel ridges having a rectangular base while the cross-section of the ridge is parabolic.

8. A solar cell arrangement as defined in claim 1, wherein said parabolic elevations rise from square base surfaces and taper narrow so that each cross-section through an elevation is parabolic perpendicular to a square base surface.

9. A solar cell arrangement as defined in claim 1, wherein said light transmissive material comprises a material selected from the group consisting of inorganic material including glass, quartz, and monocrystals, or organic material, including polycarbonate, epoxy resin and polyacrylonitrile.

10. A solar cell arrangement as defined in claim 1, wherein the intermediate spaces defined between said plates or discs are evacuated, filled with protective gas or filled with a preservation liquid.

11. A solar cell arrangement as defined in claim 1 wherein said semiconductor comprises a polycrystalline layer made from a material selected from the group consisting of III/V compounds and II/VI compounds.

12. A solar cell arrangement as defined in claim 5, wherein said thin insulator layers comprises a material selected from the group consisting of thermal oxides, anodic oxides, oxides produced chemically and oxides vaporized or atomized at high vacuum, nitrides, sulphides, chalcogenides and organic insulators.

13. A solar cell arrangement as defined in claim 1, wherein said metallically conductive layers comprise metals or compounds having a small electron work function and other metals or compounds having a large electron work function.

14. A solar cell arrangement as defined in claim 13 wherein said metallically conductive layers having a small electron work function comprise a material selected from the group consisting of Be, Al, Zr, Hf, Zn, rare-earth metals, LaB$_6$, GdB$_6$, WB, and BaSe and said metallically conductive layers having a large electron work function comprise a material selected from the group consisting of Pt, Pd, Ru, Au, Ni, Cu, Fe, TbB$_6$, EuB$_6$, SmB$_6$, MuB$_2$, and TiB$_2$.

15. A solar cell arrangement as defined in claim 1 and comprising an arrangement having a p-semiconductor cell and an n-semiconductor cell serially electrically connected.

16. A solar cell arrangement as defined in claim 1, and further comprising a lens, a mirror or a fluorescence collector for concentrating sunlight.

17. A solar cell arrangement as defined in claim 1, and further comprising means for cooling the arrangement.

18. A solar cell arrangement comprising a first plate or disc of light transmissive material, a structure comprising light transmissive elevations tapering parabolically on one side of said first plate or disc and cut off parallel to the surface of said first plate or disc at the level of their focal points or lines, a layer of at least partially light transmissive electrically conductive material on the surface of said elevations and a second plate or disc of semiconductor or metallically conductive material assembled to said first plate or disc to provide photovoltaic or electrical contacts between said cut off surfaces of said elevations of said first plate or disc with the surface of said second plate or disc whereby light which passes through said first plate or disc is concentrated at said contacts.

* * * * *